United States Patent
Fujita

(10) Patent No.: US 6,525,465 B1
(45) Date of Patent: Feb. 25, 2003

(54) EL DEVICE WITH INSULATING LAYER OF A BROMIDE OR IODIDE

(75) Inventor: Yoshimasa Fujita, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/526,715

(22) Filed: Mar. 16, 2000

(30) Foreign Application Priority Data

Mar. 16, 1999 (JP) .......................... 11-070299

(51) Int. Cl.$^7$ ................ H05B 33/00; H05B 33/02; H05B 33/24
(52) U.S. Cl. ................ 313/504; 313/506; 313/509; 428/690
(58) Field of Search ................ 313/498, 502, 313/503, 504, 506, 509; 428/690, 917

(56) References Cited

U.S. PATENT DOCUMENTS

| | | | | |
|---|---|---|---|---|
| 5,663,573 A | * | 9/1997 | Epstein et al. | 313/504 |
| 5,739,635 A | * | 4/1998 | Wakimoto | 313/504 |
| 5,853,905 A | * | 12/1998 | So et al. | 313/504 |
| 5,858,561 A | * | 1/1999 | Epstein et al. | 313/504 |

FOREIGN PATENT DOCUMENTS

| | | | | |
|---|---|---|---|---|
| EP | 327355 A2 | * | 8/1989 | H05B/33/22 |
| EP | 740489 A1 | * | 10/1996 | H05B/33/12 |
| EP | 869701 A2 | * | 10/1998 | H05B/33/26 |
| JP | 10-74586 A | | 3/1998 | |

OTHER PUBLICATIONS

Adachi et al., "Blue Light–Emitting Organic Electroluminescent Devices", App. Phys. Lett., vol. 56, No. 9, Feb. 26, 1990, pp. 799–801.
Burroughes et al., "Light–Emitting Diodes Based on Conjugated Polymers", Nature, vol. 347, Oct. 11, 1990, pp. 539–541.
Kido et al., "Poly(methylphenylsilane) Film as a Hole Transport Layer in Electroluminescent Devices", Appl. Phys. Lett., vol. 59, No. 21, Nov. 18, 1991, pp. 2760–2762.
Tang et al., "Organic Electroluminescent Diodes", Appl. Phys. Lett., vol. 51, No. 21, Sep. 21, 1987, pp. 913–915.
Akira et al, "Organic Electroluminescent Devices with Dithienosilole Derivatives", 16p–YH–2, Sep. 1998, pp. 1087.
Suzuki et al. "Emission Characteristics of Organic EL Devices with Metal/Organic Co–evaporated Interface", 16a–YH–7, Sep. 1998, pp. 1085.
Fujikawa et al., " Organic EL Devices Using Alkaline–Earth Metal Fluorides as an Electron Injection Layer", 29a–YF–8, Mar. 1998, pp. 1228.

* cited by examiner

Primary Examiner—Nimeshkumar D. Patel
Assistant Examiner—Mariceli Santiago
(74) Attorney, Agent, or Firm—Nixon & Vanderhye P.C.

(57) ABSTRACT

An organic electroluminescent device having: a pair of an anode and cathode, a single-layered or multi-layered film therebetween containing an organic luminescent material and an insulating film of a chloride, a bromide or an iodide between the cathode and the single-layered or multi-layered film, the device being adapted to emit light by application of voltage or current across the pair of electrodes.

8 Claims, 2 Drawing Sheets

EL DEVICE WITH INSULATING LAYER OF A BROMIDE OR IODIDE

CROSS-REFERENCE TO RELATED APPLICATION

This application is related to Japanese Patent Application No. HEI 11(1999)-070299 filed on Mar. 16, 1999, whose priority is claimed under 35 USC § 119, the disclosure of which is incorporated by reference in its entirety.

BACKGROUND OF THE INVENTION

1. Field of the Invention

The present invention relates to an organic electroluminescent (hereinafter referred to as EL) device. More particularly, the invention relates to an organic thin-film EL device which can convert electric energy directly to luminous energy when an electric field is applied to its light emitting layer comprised of an organic luminescent substance. The device is usable for a flat light source and a display device.

2. Description of Related Art

With advances of information technology, there has been an increasing need for full color flat panel displays as thinner, less power-consuming and more lightweight display devices than CRTs.

Known as such displays are liquid crystal displays (LCDs) which are not self-luminous, and plasma displays (PDPs) and electroluminescent (EL) displays which are self-luminous.

The EL displays are generally classified, according to their mechanisms of exciting light emission and their constituent materials, into two groups: (1) intrinsic EL devices in which a luminescent substance is excited by local movement of electrons and holes within a light emitting layer and light emission takes place by application of an AC electric field and (2) charge injection type EL devices in which a luminescent substance is excited by recombination of electrons and holes injected from electrodes within a light emitting layer and light emission takes place by application of a DC electric field. For (1) the intrinsic EL devices, inorganic materials are generally used, while for (2) the charge injection type EL devices, organic materials are generally used. That is, the relationship of the intrinsic EL devices being inorganic EL devices and the charge injection type EL devices being organic EL devices holds.

Among these EL devices, the organic EL devices especially are paid remarkable attention to because they have the characteristics of being self-luminous, being able to be designed to consume less power and emitting a wide variety of colors of light.

Conventionally, well known are organic EL devices having a laminated three-layer structure (Appl.Phys.Lett. 56(9) February 1990). An EL device of this kind is constructed to have an anode (positive electrode) formed of an electrode material with a high work function such as indium—tin oxide (ITO) on the surface of a transparent substrate of glass or the like; a hole transporting layer, a light emitting layer and an electron transporting layer which are organic layers formed on the anode; and further a cathode (negative electrode) formed of an electrode material with a low work function such as Mg/Ag on the top. By applying voltage across both the electrodes of this organic EL device or by passing electric current across the electrodes, electrons and holes are injected into the light emitting layer. Energy generated by recombination of electron-hole pairs within the light emitting layer is released as fluorescence or phosphorescence. Light is thus emitted. Accordingly, light of optional colors, blue to red, can be obtained by using luminescent materials having fluorescence of blue to red for the light emitting layer.

In the organic EL devices, the charge injection type EL devices, effective injection of charges from the electrodes (i.e., holes from the anode and electrons from the cathode) to the organic layers is important from the viewpoint of reducing power consumption. Usually, electrons injected from the cathode fall short of holes injected from the anode. For this reason, to improve efficiency in injecting electrons from the cathode (hereinafter referred to as electron injection efficiency) is essential for low-voltage driving of EL devices and enhanced efficiency thereof.

In order to raise the electron injection efficiency, (1) using a cathode material which provides a higher electron injection efficiency,
(2) using, as the cathode, a laminated conductive layer of a metal having a low work function and a stable metal,
(3) using, as the cathode, a mixture electrode of a metal having a small work function and a stable metal,
(4) providing a buffer layer (an electron injection layer) between the cathode and the organic layers,
(5) providing a co-deposited layer between the cathode and the organic layers, and the like have been conventionally studied.

Typical examples of (1) include a calcium cathode (Nature, 347, 539 541) and the like. Typical examples of (2) include a layered cathode of Mg and Ag (Appl.Phys.Lett., 59(21), Nov. 18, 1991) and the like. Typical examples of (3) include a co-deposited cathode of Mg and Ag (Appl.Phys.Lett., 51(12), Sep. 21, 1987), co-deposited cathode of Li and Al (Synthetic Materials, 91(1997)129–130) and the like. Typical examples of (4) include an electron injection layer of dithienosilole (The 59th Autumn Meeting, 1998; the Japan Society of Applied Physics, 16p-YH-2) and the like. Typical examples of (5) include a co-deposited layer of $Alq_3$/Mg between an organic layer of $Alq_3$ and an electrode of Mg (The 59th Autumn Meeting, 1998; the Japan Society of Applied Physics, 16a-YH-7).

However, according to (1), (2) and (3), since Ca, Mg and Li used in cathodes react with moisture to produce hydroxides, there arises a problem in stability. In addition, according to (3), it is difficult to produce mixture electrodes with maintaining a constant ratio of the two metals, and therefore, it is hard to obtain cathodes having stable properties. As for (4) and (5), there is a problem in that the electron injection efficiency is poorer compared with the other three.

In these circumstances, Han et al. (Japanese Unexamined Patent Publication No. HEI 10(1998)-74586 and Fujikawa et al. (The 59th Autumn Meeting, 1998; the Japan Society of Applied Physics, 16a-YH-7) propose cathodes having a combined structure of an insulating layer of a fluoride and a conductive layer of a metal.

However, even though such a cathode composed of a metal and an insulator of a fluoride is used for an organic EL device, sufficient injection of electrons into the organic layers has not been achieved yet.

SUMMARY OF THE INVENTION

The present invention provides an organic electroluminescent device comprising: a pair of an anode and cathode, a single-layered or multi-layered film therebetween containing an organic luminescent material and an insulating film of a chloride, a bromide or an iodide between the cathode and the single-layered or multi-layered organic film, the device being adapted to emit light by application of voltage or current across the pair of electrodes.

In other words, as a result of concentrated studies of the buffer layer, materials for the cathode and the like for improving the electron injection efficiency, the inventors of the present invention have improved the electron injection efficiency by providing an insulating layer of a cation metal having a low work function between the cathode and the layer of an organic luminescent material, and consequently have realized an organic EL device which can be driven with a low voltage, finally to achieve the present invention.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The organic EL device of the present invention is composed mainly of an anode, a single-layered or multi-layered film containing an organic luminescent material, an insulating layer and a cathode. Usually, these are formed on a substrate in this order or in reverse order.

For example, the organic EL device of the present invention constructed as described above may have structures shown in FIGS. 1 to 4.

Figure 1:
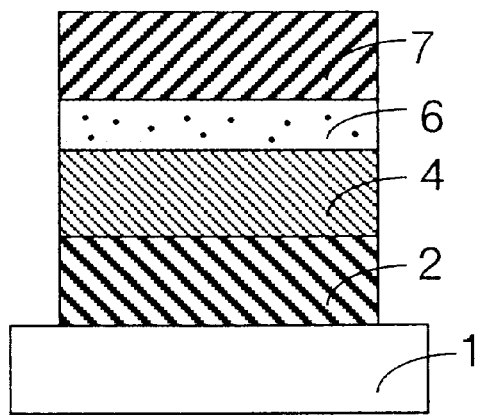
FIG. 1 is a schematic sectional view of a main part of an organic EL device in accordance with an embodiment of the present invention.
Figure 2:
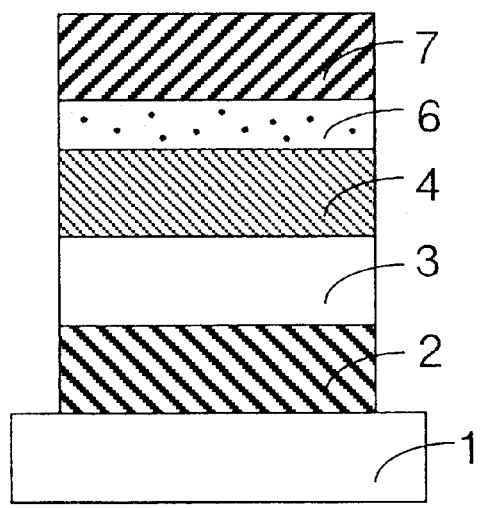
FIG. 2 is a schematic sectional view of a main part of an organic EL device in accordance with another embodiment of the present invention.
Figure 3:
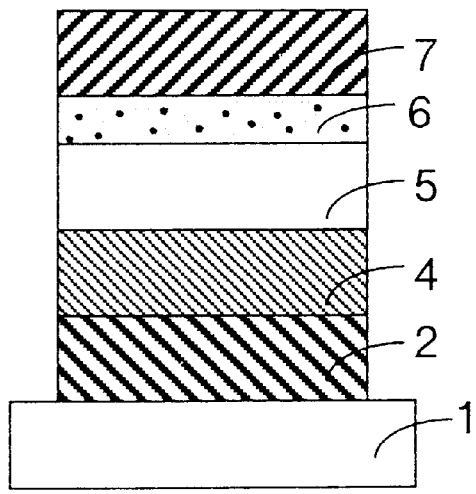
FIG. 3 is a schematic sectional view of a main part of an organic EL device in accordance with still another embodiment of the present invention.
Figure 4:
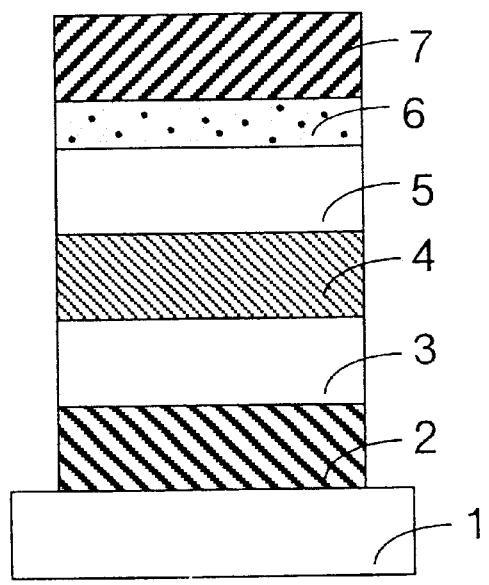
FIG. 4 is a schematic sectional view of a main part of an organic EL device in accordance with still another embodiment of the present invention.

The organic EL device shown in FIG. 1 is constructed to have an anode 2, a light emitting layer 4, an insulating layer 6 of a chloride, a bromide or an iodide and a cathode 7 which are formed in this order on a transparent substrate 1. The organic EL device shown in FIG. 2 is constructed to have an anode 2, a hole transporting layer 3, a light emitting layer 4, an insulating layer 6 of a chloride, a bromide or an iodide and a cathode 7 which are formed in this order on a transparent substrate 1. The organic EL device shown in FIG. 3 is constructed to have an anode 2, a light emitting layer 4, an electron transporting layer 5, an insulating layer 6 of a chloride, a bromide or an iodide and a cathode 7 which are formed in this order on a transparent substrate 1. The organic EL device shown in FIG. 4 is constructed to have an anode 2, a hole transporting layer 3, a light emitting layer 4, an electron transporting layer 5, an insulating layer 6 of a chloride, a bromide or an iodide and a cathode 7 which are formed in this order on a transparent substrate 1.

In the organic EL device of the present invention, materials for the substrate are not particularly limited provided that they are transparent. For example, mentioned are substrates of inorganic materials such as quarts and glass, substrates of plastic films or sheets of polyester, polymethacrylate, polycarbonate polysulfone and the like.

Materials for the anode are not particularly limited, but may be metals, alloys, electrically conductive compounds having a work function of 4 eV or more and mixtures thereof from the viewpoint of effective injection of holes into an organic layer. Specifically, may be mentioned aluminum, vanadium, cobalt, nickel, tungsten, silver, gold and alloys thereof as well as transparent electrode materials such as CuI, ITO, $SnO_2$, ZnO and the like. The anode can be formed as a film of these electrode materials by sputtering, by vacuum evaporation or the like. The thickness thereof is not particularly limited, but the sheet resistance thereof is preferably about 100 $\Omega/\square$ or less.

Materials for the cathode are not particularly limited, but may be metals, alloys, electrically conductive compounds having a work function of 4.5 eV or less and mixtures thereof from the viewpoint of effective injection of electrons into the light emitting layer. Specifically, may be mentioned lithium, magnesium, calcium, aluminum, silver, titanium, yttrium, ruthenium, manganese, indium and the like as well as alloys such as magnesium-silver, indium-silver, lithium-aluminum, and mixtures thereof. The cathode can be formed as a film of these electrode materials by sputtering, by vacuum evaporation or the like. The thickness thereof is not particularly limited, but may be about 100 to 300 nm, for example.

It is noted that, among the above-mentioned anode materials, two kinds of materials can be used as the anode and the cathode of the organic EL device if they are so selected that the work function of the anode is relatively larger than that of the cathode (for example, Au for the anode and ITO for the cathode). Therefore, the magnitude of the work function as reference for selecting materials for the anode or cathode is not limited to 4 eV or 4.5 eV.

The single-layered or multi-layered film sandwiched between the anode and the cathode may be formed as described in the following î to 4̂.

î The film may be formed as a single-layered or multi-layered film containing an organic luminescent material. The film may be formed to contain the organic luminescent material alone, to contain a hole transporting material and/or an electron transporting material as well as the organic luminescent material, or to contain the organic luminescent material which is dispersed in an inorganic material or in a polymeric material. These materials may be formed into a film by a dry process such as vacuum evaporation, CVD, plasma CVD or sputtering method, or by a wet process such as spin coating or LB method. The thickness is not particularly limited but is preferably about 1 $\mu$m or less, for example.

Here, organic luminescent materials are not particularly limited so far as they are used as luminescent materials for organic EL devices. For example, mentioned are low-molecular materials such as metal oxinoid compounds (metal complexes of 8-hydroxyquinoline), diphenylethylene derivatives, vinyl acetone derivatives, triphenylamine derivatives, butadiene derivatives, coumalin derivatives, benzoxazole derivatives, oxadiazole derivatives, oxazole derivatives, thiadiazole derivatives, styrylamine derivatives, bisstyrylbenzene derivatives, trisstyrylbenzene derivatives, perylene derivatives, perinone derivatives, aminopyrene derivatives, pyridine derivatives, Rhodamine derivatives, acridine derivatives, phenoxazone derivatives, quinacridone derivatives and rubrene and high-molecular materials such as poly-p-phenylenevinylene and polysilane.

Hole transporting materials are not particularly limited so far as they are photoconductive substances conventionally used as materials for transporting electric charges of holes or substances conventionally used as hole transporting materials in organic EL devices. For example, mentioned are low-molecular materials such as porphyrin derivatives, aromatic tert-amine compounds and styrylamine derivatives and high-molecular materials such as polyvinyl carbazole, poly-p-phenylenevinylene and polysilane.

Electron transporting materials are not particularly limited so far as they are photoconductive substances conventionally used as materials for transporting electric charges of electrons or substances conventionally used as electron transporting materials in organic EL devices. For example, mentioned are low-molecular materials such as oxadiazole derivatives, triazole derivatives, thiopyrazineoxide derivatives, benzoquinone derivatives, naphthoquinone derivatives, anthraquinone derivatives, diphenoquinone derivatives, fluorenone derivatives and silole compounds.

Polymeric materials for dispersing the organic luminescent material are not particularly limited so far as they are conventionally used in the field of art. For example, mentioned are polyvinyl carbazole, polycarbonate and polymethylmetharylate.

Inorganic materials for dispersing the organic luminescent material are not particularly limited so far as they are conventionally used in the field of art. For example, mentioned are SiO, $SiO_2$ and MgO.

2̂ The film sandwiched between the anode and cathodes may be formed separately from the hole transporting layer. In this case, both the film sandwiched between the anode and cathodes and the hole transporting layer may be formed as single-layered or multi-layered films. The film sandwiched between the anode and cathodes may contain the organic luminescent material alone or the organic luminescent material which is dispersed in an inorganic material or in a polymeric material. Further a dopant may be doped in the film. These films may be formed as films by a dry process such as vacuum evaporation, CVD, plasma CVD or plasma sputtering method or by a wet process such as spin coating or LB method. The thickness of these films is not particularly limited, but may preferably be about 1 $\mu$m or less, for example.

As organic luminescent materials, those mentioned above may also be mentioned here. Preferably, the organic luminescent materials have the capability to transport electrons. For example, mentioned are low-molecular materials such as metal oxinoid compounds, oxazole derivatives, oxadiazole derivatives, thiadiazole derivatives, styrylamine derivatives, bisstyrylbenzene derivatives, perylene derivatives and perinone derivatives and high-molecular materials such as poly-p-phenylenevinylene and polysilane.

As polymeric materials and inorganic materials for dispersing the organic luminescent material, those mentioned above may also be mentioned here.

As dopants, may be mentioned fluorescent pigments such as coumalin, pyridine, Rhodamin and acridine dyes, phenoxazone, DCM, quinacridone and rubrene.

The hole transporting layer may contain only one kind of hole transporting material or tow or more kinds of hole transporting materials. The hole transporting materials may be dispersed in a polymeric material or in an inorganic material. Also other additives may be doped as required. These materials may be formed as a film by a dry process such as vacuum evaporation, CVD, plasma CVD or sputtering method or by a wet process such as spin coating or LB method.

The hole transporting materials are not particularly limited to any kind provided that they are known inorganic compounds such as inorganic semiconductors, photoconductive substances conventionally used as materials for transporting electric charges of holes, organic compounds used as materials for transporting electric charges of holes in organic EL devices, or the like. For example, mentioned are p-type hydrogenated amorphous silicon, p-type hydrogenated amorphous silicon carbide, p-type zinc sulfide and p-type zinc selenide as inorganic compounds and, as organic compounds, those mentioned above.

As polymeric materials or inorganic materials for dispersing the hole transporting material, those described above may be mentioned here.

Optionally added additives are not particularly limited, but may be acceptors such as Au, Pt, Br, I, 7,8,8,8-tetracyanoquinodimethane, trinitrofluorenone and bromanil, for example.

3̂ The film sandwiched between the anode and cathodes may be formed separately from the electron transporting layer. Also in this case, both the film sandwiched between the anode and cathodes and the electron transporting layer may be formed as single-layered or multi-layered films. The film sandwiched between the anode and cathodes may contain the organic luminescent material alone or the organic luminescent material which is dispersed in an inorganic material or in a polymeric material. Further dopants may be doped. These films may be formed as films by a dry process such as vacuum evaporation, CVD, plasma CVD or plasma sputtering method, or by a wet process such as spin coating or LB method. The thickness of these films is not particularly limited, but may preferably be about 1 $\mu$m or smaller, for example.

Here, the organic luminescent material may be one as described above, but may preferably have the function of transporting holes. For example, mentioned are low-molecular materials such as diphenylethylene derivatives, vinylanthracene derivatives and triphenylamine derivatives and high-molecular materials such as poly-p-phenylenevinylene and polysilane.

As inorganic materials and polymeric materials for dispersing the organic luminescent material and dopants, those mentioned above may also be mentioned here.

The electron transporting layer may contain only one kind of electron transporting material or tow or more kinds of electron transporting materials. The electron transporting materials may be dispersed in a polymeric material or in an inorganic material. Also other additives may be doped as required. These materials may be formed as a film by a dry process such as vacuum evaporation, CVD, plasma CVD or sputtering method, or by a wet process such as spin coating or LB method.

The electron transporting materials may be known inorganic materials such as inorganic semiconductors, photoconductive substances conventionally used as materials for transporting electric charges of electrons and organic compounds such as those used as electron transporting materials in organic EL devices. For example, mentioned are n-type hydrogenated amorphous silicon, n-type zinc sulfide and n-type zinc selenide as inorganic compounds and, as organic compounds, those mentioned above.

As polymeric materials and inorganic materials for dispersing the electron transporting material, those mentioned above may also be mentioned here.

Optionally added additives are not particularly limited, but may be doners such as alkali metals, alkali earth metals, rare earth elements, triphenylamine derivatives and condensed polycyclic compounds, for example.

④ The film sandwiched between the anode and cathodes may be formed separately from the hole transporting layer and the electron transporting layer. Also in this case, the film sandwiched between the anode and cathodes, the hole transporting layer and the electron transporting layer may all be formed as single-layer or multi-layered films. The film sandwiched between the anode and cathodes may contain the organic luminescent material alone, or the organic luminescent material which is dispersed in an inorganic material or in a polymeric material. Further dopants may be doped. The hole transporting layer and the electron transporting layer may each contain only a hole transporting material or an electron transporting material, or the hole transporting material and the electron transporting material may be dispersed in an inorganic material or in a polymeric material. These film and layers may be formed as films by a dry process such as vacuum evaporation, CVD, plasma CVD or plasma sputtering method, or by a wet process such as spin coating or LB method. The thickness of these layers is not particularly limited, but may preferably be about 1 μm or smaller, for example.

As organic luminescent materials, those mentioned above may also be mentioned here. Also the hole transporting layer and the electron transporting layer may be made of materials as mentioned above.

For the insulating layer, chlorides (alkali chlorides, alkali earth chlorides), bromides (alkali chlorides, alkali earth chlorides), iodides (alkali chlorides, alkali earth chlorides) may be used singly or as a combination of two or more thereof. Among such compounds, KCl, RbCl, CsCl, CaCl, SrCl, BaCl, KBr, RbBr, CsBr, CaBr, SrBr, BaBr, KI, RbI, CsI, CaI, SrI and BaI are preferable, and RbCl, CsCl, RbBr, CsBr, RbI and CsI are more preferable. These insulators can be formed into films by sputtering, vacuum deposition or the like. The thickness of the insulating layer may suitably be 8 nm or smaller, preferably 5 nm or smaller, more preferably within the range of 0 nm (exclusive) to 5 nm (inclusive) and still more preferably within the range of 0.3 nm (inclusive) to 2.0 nm (inclusive).

In the organic EL device of the present invention, the above-described layers and film are formed as films on the substrate by the above-described processes. The thickness of the layers is not particularly limited, but may be selected as required depending upon desired performance from the organic EL device to be produced and materials contained in the layers. If the thickness is too large, the internal resistance of the device rises and a larger voltage is required to be applied for obtaining a given output. As a result, the efficiency declines. On the other hand, if the thickness is too small, pinholes or the like are generated, and a sufficient luminance cannot be obtained from emitted light even if an electric field is applied. For example, each of the layers may be about 10 nm to about 100 nm thick.

Embodiments of the organic EL device of the present invention are now explained with reference to the accompanying drawings.

Embodiment 1

First, ITO films were formed to a thickness of 200 nm on glass substrates of 50 mm square by sputtering and then patterned to have stripes of 2 mm width. After water washing, the resulting substrates were supersonically washed in water for 10 minutes, supersonically washed in acetone for 10 minutes, washed with vapor of isopropyl alcohol for 5 minutes and dried in a dryer at 100° C. for an hour.

Next, the resulting substrates were fixed on substrate holders in a resistive heating deposition apparatus. The pressure in the apparatus was then reduced to a vacuum of $1 \times 10^{-4}$ Pa.

Afterwards, a 9,10-bisstyrylanthracene derivative (hereinafter referred to as BSA for short) represented by the following formula:

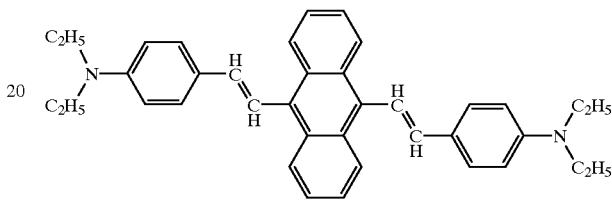

was deposited as light emitting layers to a thickness of 100 nm at a deposition rate of 0.2 nm/sec.

Subsequently, cesium chloride (hereinafter referred to as CsCl), cesium bromide (hereinafter referred to as CsBr), cesium iodide (hereinafter referred to as CsI), rubidium chloride (hereinafter referred to as RbCl), rubidium bromide hereinafter referred to as RbBr), rubidium iodide (hereinafter eferred to as RbI), potassium chloride (hereinafter referred to as KCl), potassium bromide (hereinafter referred to as KBr) and potassium iodide (hereinafter referred to as KI) were deposited as insulating layers to a thickness of 0.6 nm on the respective substrates at a deposition rate of 0.02 nm/sec.

Lastly, the resulting substrates were covered with masks of stainless steel in stripes of 2 mm width for forming rear electrodes, and aluminum (hereinafter referred to as Al) was deposited thereon to a thickness of 200 nm at a deposition rate of 0.6 nm/sec, thereby to form cathodes. Thus nine kinds of organic EL devices were produced.

Embodiment 2

Another nine kinds of organic EL devices were produced in the same manner as in Embodiment 1 except that magnesium (hereinafter referred to as Mg) and silver (hereinafter referred to as Ag) were co-deposited at deposition rates of 0.4 nm/sec. and 0.04 nm/sec., respectively, to a thickness of 200 nm as cathodes instead of aluminum.

Comparative Example 1

Organic EL devices were produced in the same manner as in Embodiments 1 and 2 except that lithium fluoride was deposited as insulating layers.

The thus produced organic EL devices were tested on voltage-current-luminance characteristics by applying voltage across the electrodes. The results are shown in Table 1.

TABLE 1

Electric Characteristics
(at a current density of 100 mA/cm$^2$)

| Insulating Film | Cathode(Al) | | Cathode(Mg/Ag) | |
|---|---|---|---|---|
| | Applied Voltage (V) | Luminance (cd/m$^2$) | Applied Voltage (V) | Luminance (cd/m$^2$) |
| CsCl | 17.3 | 1060 | 17.3 | 1040 |
| CsBr | 17.2 | 1050 | 17.2 | 1080 |
| CsI | 17.4 | 1030 | 17.2 | 1120 |
| RbCl | 18.8 | 1060 | 18.3 | 1100 |
| RbBr | 19.1 | 1030 | 18.4 | 1060 |
| RbI | 19.0 | 1040 | 17.9 | 1080 |
| KCl | 20.2 | 1020 | 19.2 | 1070 |
| KBr | 20.1 | 1000 | 19.1 | 1070 |
| KI | 20.3 | 1030 | 19.0 | 1060 |
| LiF | 21.6 | 1010 | 20.4 | 1070 |

Embodiment 3

First, ITO films were formed to a thickness of 200 nm on glass substrates of 50 mm square by sputtering and then patterned to have stripes of 2 mm width. After water washing, the resulting substrates were supersonically washed in water for 10 minutes, supersonically washed in acetone for 10 minutes, washed with vapor of isopropyl alcohol for 5 minutes and dried in a dryer at 100° C. for an hour.

Next, the resulting substrates were fixed on substrate holders in a resistive heating deposition apparatus. The pressure in the apparatus was then reduced to a vacuum of $1 \times 10^{-4}$ Pa.

Afterwards, N,N'-diphenyl-N,N'-bis(1-naphthyl) 1,1'-biphenyl-4,4'-diamine (hereinafter referred to as NPD) represented by the following formula:

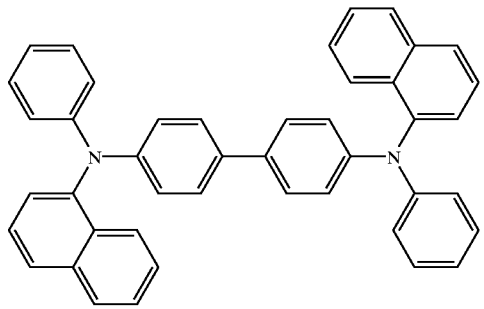

was deposited as hole transporting layers to a thickness of 50 nm at a deposition rate of 0.2 nm/sec.

Subsequently, tris(8-hydroxyquinolinate)aluminum (hereinafter referred to as Alq$_3$) represented by the following formula:

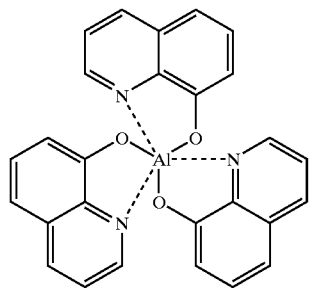

was deposited as light emitting layers to a thickness of 50 nm at a deposition rate of 0.2 nm/sec.

Further, CsCl, CsBr, CsI, RbCl, RbBr, RbI, KCl, KBr and KI were deposited as insulating layers to a thickness of 0.6 nm on the respective substrates at a deposition rate of 0.02 nm/ sec.

Lastly, the resulting substrates were covered with masks of stainless steel in stripes of 2 mm width for forming rear electrodes, and Al was deposited to a thickness of 200 nm at a deposition rate of 0.6 nm/sec, thereby to form cathodes. Thus nine kinds of organic EL devices were produced.

Embodiment 4

Another nine kinds of organic EL devices were produced in the same manner as in Embodiment 3 except that Mg and Ag were co-deposited at deposition rates of 0.4 nm/sec. and 0.04 nm/sec., respectively, to a thickness of 200 nm as cathodes instead of aluminum.

Comparative Example 2

Organic EL devices were produced in the same manner as in Embodiments 3 and 4 except that lithium fluoride was deposited as insulating layers.

The thus produced organic EL devices were tested on voltage-current-luminance characteristics by applying voltage across the electrodes. The results are shown in Table 2.

TABLE 2

Electric Characteristics
(at a current density of 100 mA/cm$^2$)

| Insulating Film | Cathode(Al) | | Cathode(Mg/Ag) | |
|---|---|---|---|---|
| | Applied Voltage (V) | Luminance (cd/m$^2$) | Applied Voltage (V) | Luminance (cd/m$^2$) |
| CsCl | 6.1 | 3070 | 6.1 | 3130 |
| CsBr | 5.9 | 3050 | 5.8 | 3100 |
| CsI | 5.8 | 3020 | 5.9 | 3100 |
| RbCl | 7.2 | 2050 | 6.6 | 3200 |
| RbBr | 7.1 | 3020 | 6.3 | 3150 |
| RbI | 6.9 | 3000 | 6.8 | 3220 |
| KCl | 8.4 | 3050 | 7.7 | 3200 |
| KBr | 8.3 | 3080 | 7.6 | 3240 |
| KI | 7.9 | 3020 | 7.7 | 3170 |
| LiF | 9.2 | 3020 | 8.8 | 3200 |

Embodiment 5

First, ITO films were formed to a thickness of 200 nm on glass substrates of 50 mm square by sputtering and then patterned to have stripes of 2 mm width. After water washing, the resulting substrates were supersonically washed in water for 10 minutes, supersonically washed in acetone for 10 minutes, washed with vapor of isopropyl alcohol for 5 minutes and dried in a dryer at 100° C. for an hour.

Next, the resulting substrates were fixed on substrate holders in a resistive heating deposition apparatus. The pressure in the apparatus was then reduced to a vacuum of $1 \times 10^{-4}$ Pa.

Afterwards, 1,1,4,4,-tetraphenyl-1,3-butadiene (hereinafter referred to as TPB) represented by the following formula:

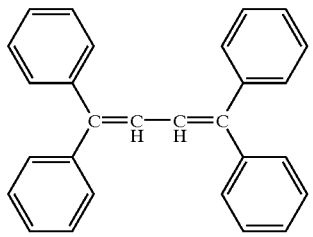

was deposited as light emitting layers to a thickness of 50 nm at a deposition rate of 0.2 nm/sec.

Subsequently, 2,(4-t-butylphenyl)-5-(4-biphenylyl)-1,3,4-oxazole (hereinafter referred to as tBu-PBD) represented by the following formula:

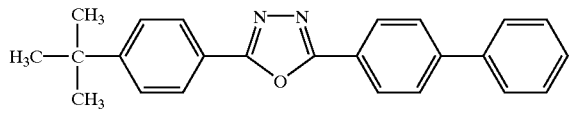

was deposited to a thickness of 50 nm at a deposition rate of 0.2 nm/sec.

Further, CsCl, CsBr, CsI, RbCl, RbBr, RbI, KCl, KBr and KI were deposited as insulating layers to a thickness of 0.6 nm on the respective substrates at a deposition rate of 0.02 nm/sec.

Lastly, the resulting substrates were covered with masks of stainless steel in stripes of 2 mm width for forming rear electrodes, and Al was deposited to a thickness of 200 nm at a deposition rate of 0.6 nm/sec, thereby to form cathodes. Thus nine kinds of organic EL devices were produced.

Embodiment 6

Another nine kinds of organic EL devices were produced in the same manner as in Embodiment 5 except that Mg and Ag were co-deposited at deposition rates of 0.4 nm/sec. and 0.04 nm/sec., respectively, to a thickness of 200 nm as cathodes instead of aluminum.

Comparative Example 3

Organic EL devices were produced in the same manner as in Embodiments 5 and 6 except that lithium fluoride was deposited as insulating layers.

The thus produced organic EL devices were tested on voltage-current-luminance characteristics by applying voltage across the electrodes. The results are shown in Table 3.

TABLE 3

| | Electric Characteristics (at a current density of 100 mA/cm$^2$) | | | |
| --- | --- | --- | --- | --- |
| | Cathode(Al) | | Cathode(Mg/Ag) | |
| Insulating Film | Applied Voltage (V) | Luminance (cd/m$^2$) | Applied Voltage (V) | Luminance (cd/m$^2$) |
| CsCl | 13.3 | 1420 | 12.1 | 1480 |
| CsBr | 13.2 | 1400 | 11.9 | 1490 |
| CsI | 13.3 | 1500 | 12.3 | 1500 |
| RbCl | 14.4 | 1430 | 13.4 | 1530 |
| RbBr | 14.3 | 1420 | 13.2 | 1550 |
| RbI | 14.3 | 1410 | 13.5 | 1490 |
| KCl | 15.6 | 1320 | 14.4 | 1440 |
| KBr | 15.2 | 1400 | 14.3 | 1420 |
| KI | 15.3 | 1420 | 14.2 | 1480 |
| LiF | 16.4 | 1420 | 15.3 | 1500 |

Embodiment 7

First, ITO films were formed to a thickness of 200 nm on glass substrates of 50 mm square by sputtering and then patterned to have stripes of 2 mm width. After water washing, the resulting substrates were supersonically washed in water for 10 minutes, supersonically washed in acetone for 10 minutes, washed with vapor of isopropyl alcohol for 5 minutes and dried in a dryer at 100° C. for an hour.

Next, the resulting substrates were fixed on substrate holders in a resistive heating deposition apparatus. The pressure in the apparatus was then reduced to a vacuum of $1 \times 10^{-4}$ Pa.

Afterwards, NPD was deposited as hole transporting layers to a thickness of 50 nm at a deposition rate of 0.2 nm/sec.

Subsequently, bis(2-methyl-8-quinolinolate)(p-phenylphenolate) aluminum (hereinafter referred to as BAlq) represented by the following

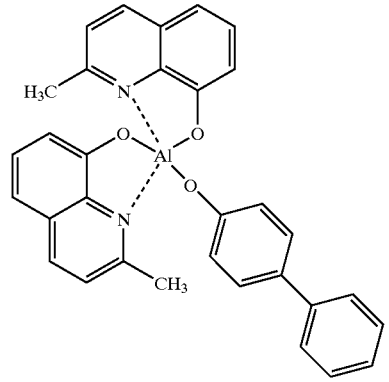

was deposited as light emitting layers to a thickness of 20 nm at a deposition rate of 0.2 nm/sec.

Further, Alq3 was deposited as electron transporting layers to a thickness of 30 nm at a deposition rate of 0.2 nm/sec.

Subsequently, CsCl, CsBr, CsI, RbCl, RbBr, RbI, KCl, KBr and KI were deposited as insulating layers to a thickness of 0.6 nm on the respective substrates at a deposition rate of 0.02 nm/sec.

Lastly, the resulting substrates were covered with masks of stainless steel in stripes of 2 mm width for forming rear electrodes, and Al was deposited to a thickness of 200 nm at a deposition rate of 0.6 nm/sec, thereby to form cathodes. Thus nine kinds of organic EL devices were produced.

Embodiment 8

Another nine kinds of organic EL devices were produced in the same manner as in Embodiment 7 except that Mg and Ag were co-deposited to a thickness of 200 nm as cathodes instead of aluminum.

Comparative Example 4

Organic EL devices were produced in the same manner as in Embodiments 7 and 8 except that lithium fluoride was deposited as insulating layers.

The thus produced organic EL devices were tested on voltage-current-luminance characteristics by applying voltage across the electrodes. The results are shown in Table 4.

TABLE 4

Electric Characteristics
(at a current density of 100 mA/cm$^2$)

| Insulating Film | Cathode(Al) | | Cathode(Mg/Ag) | |
|---|---|---|---|---|
| | Applied Voltage (V) | Luminance (cd/m$^2$) | Applied Voltage (V) | Luminance (cd/m$^2$) |
| CsCl | 7.6 | 1900 | 6.3 | 1940 |
| CsBr | 7.5 | 2000 | 6.2 | 1980 |
| CsI | 7.2 | 2950 | 6.3 | 2000 |
| RbCl | 8.3 | 2000 | 7.3 | 2000 |
| RbBr | 8.6 | 2010 | 7.2 | 2100 |
| RbI | 8.3 | 1980 | 7.4 | 1980 |
| KCl | 9.2 | 1890 | 8.4 | 2000 |
| KBr | 9.1 | 1920 | 8.2 | 2010 |
| KI | 9.4 | 1940 | 8.6 | 1890 |
| LiF | 10.2 | 1880 | 9.4 | 1900 |

Embodiment 9

Six kinds of organic EL devices were produced n the same manner as in Embodiment 7 by changing the thickness of the RbCl layer to 0 nm, 0.3 nm, 1.0 nm, 2.0 nm, 4.0 nm and 8.0 nm.

The thus produced organic EL devices were tested on voltage-current-luminance characteristics by applying voltage across the electrodes. The results are shown in Table 5.

TABLE 5

Electric Characteristics
(at a current density of 100 mA/cm$^2$)

| Thickness of RbCl Layer (nm) | Applied Voltage (V) | Luminance (cd/m$^2$) |
|---|---|---|
| 0 | 13.6 | 860 |
| 0.3 | 8.7 | 1960 |
| 0.6 | 8.4 | 1920 |
| 1.0 | 8.1 | 2000 |
| 2.0 | 9.0 | 1940 |
| 4.0 | 11.0 | 1800 |
| 8.0 | 20.0 | 800 |

According to the present invention, in an organic electroluminescent device in which a single-layered or multi-layered film containing an organic luminescent material is sandwiched between a pair of electrodes, i.e., an anode and a cathode, an insulating layer of a chloride, a bromide or an iodide is provided between the cathode and the single-layered or multi-layered film. This improves the injection of electrons from the cathode and enables the device to be driven with a decreased voltage.

Furthermore, if the insulating layer is formed of cesium bromide, rubidium bromide, potassium bromide, cesium chloride, rubidium chloride, potassium chloride, cesium iodide, rubidium iodide or potassium iodide and/or the insulating layer is formed in a thickness of 5.0 nm or less, the efficiency in injecting electrons from the cathode is further improved, which enables driving with a still lower voltage.

What is claimed is:

1. An organic electroluminescent device comprising:

a pair of electrodes including an anode and cathode, a single-layered or multi-layered film therebetween containing an organic luminescent material and an insulating film of a bromide or an iodide between the cathode and the single-layered or multi-layered film, wherein the insulating film includes an element of Group 1A but no element of any of Groups 2A, 3A and 3B, the device being adapted to emit light by application of voltage or current across the pair of electrodes.

2. An organic electroluminescent device according to claim 1, wherein the insulating layer is formed of cesium bromide, rubidium bromide, potassium bromide, cesium iodide, rubidium iodide or potassium iodide.

3. An organic electroluminescent device according to claim 2, wherein the insulating layer is formed of cesium bromide, rubidium bromide, cesium iodide or rubidium iodide.

4. An organic electroluminescent device according to claim 1, wherein the insulating film has a thickness of 5.0 nm or less.

5. An organic electroluminescent device according to claim 1, wherein materials for the anode and cathode are electrically conductive compounds having a work function of 4 eV or more and of 4.5 eV or less, respectively.

6. An organic electroluminescent device according to claim 1, wherein the single-layered or multi-layered film comprises one of: (a) the organic luminescent material alone, (b) a hole transporting material and an electron transporting material as well as the organic luminescent material, (c) an electron transporting material as well as the organic luminescent material, or (d) a hole transporting material as well as the organic luminescent material.

7. An organic electroluminescent device according to claim 6, wherein at least one of the organic luminescent material, the hole transporting material and the electron transporting material is dispersed in an inorganic material or in a polymeric material.

8. An organic electroluminescent device according to claim 1, wherein the thickness of the single-layered or multi-layered film is about 1 μm or less.

* * * * *